United States Patent [19]

Nakamura et al.

[11] Patent Number: 5,625,287

[45] Date of Patent: Apr. 29, 1997

[54] TEST TRAY POSITIONING STOPPER MECHANISM FOR AUTOMATIC HANDLER

[75] Inventors: Hiroto Nakamura, Kazo; Makoto Sagawa; Yoshihito Kobayashi, both of Gyoda, all of Japan

[73] Assignee: Advantest Corporation, Tokyo, Japan

[21] Appl. No.: 410,821

[22] Filed: Mar. 27, 1995

[30] Foreign Application Priority Data

Jun. 30, 1994 [JP] Japan ................................ 6-171913

[51] Int. Cl.$^6$ ............................................ G01R 31/02
[52] U.S. Cl. ........................................ 324/158.1; 324/758
[58] Field of Search .............................. 324/158.1, 754, 324/758, 757; 209/573; 414/225, 416

[56] References Cited

U.S. PATENT DOCUMENTS

| 3,236,374 | 2/1966 | Zimmerman et al. | 324/158.1 |
|---|---|---|---|
| 4,320,339 | 3/1982 | Vancelette | 324/754 |
| 5,313,156 | 5/1994 | Klug et al. | 209/573 |

*Primary Examiner*—Ernest F. Karlsen
*Attorney, Agent, or Firm*—Knobbe, Martens, Olson & Bear, LLP

[57] ABSTRACT

An automatic handler for an IC test system is disclosed which is capable of reducing a time for transferring IC devices to be tested from a supply area to a test head area and from the test head area to a discharge area. The automatic handler includes a test tray for loading the IC devices to be tested in which the IC devices to be tested are aligned in the test tray with a shorter distance with one another than a distance between test contactors in the test head area, a pair of positioning stoppers provided in the test head area along a moving direction of the test tray in which the positioning stoppers are spaced by the distance equal to the distance of the IC devices to be tested in the test tray. In the automatic handler, the distance of the contactors is adjusted to an integer multiple of the distance of the IC devices to be tested in the test tray. One of the positioning stoppers contacts the test tray to determine a first position for testing the IC devices in a first line in the test tray, and then the test tray is transferred until other positioning stoppers contacts the test tray in a second position for testing the IC devices in a second line in the test tray. The test tray is then transferred to the discharge area. Another aspect of the automatic handler is provided with a groove on the test tray to increase a number of test position for the test tray. The groove includes an end surface which engages with the positioning stoppers.

4 Claims, 9 Drawing Sheets

TEST TRAY POSITIONING STOPPER MECHANISM FOR AUTOMATIC HANDLER

FIELD OF THE INVENTION

The present invention relates to an automatic handler for an IC test system that transfers IC devices to be tested, from a supply area to a test head area and then to a discharge area, which is capable of minimizing a time for transferring test trays having the IC devices thereon and replacing the test trays, and more particularly, a test tray positioning stopper mechanism for automatic handler to increase flexibility and a choice of a number of IC devices to be tested simultaneously.

BACKGROUND OF THE INVENTION

In general, an IC test system performs an IC device test by electrically contacting IC devices to be tested with test contactors in pin electronics or pin cards provided in a test head area to supply test signals to the IC devices and receive the resulted outputs from the IC devices. The resulted signals are compared with expected signals to determine whether the outputs from the IC devices are acceptable or not.

Hence, an automatic handler transfers IC devices to be tested from a supply area to a test head area. After the test, IC devices that have been tested are transferred from test the head area to a discharge area and are sorted according to the test results. During these times required for transferring the IC devices, the test cannot be performed since IC devices to be tested cannot determine their position with respect to contactors in the test head and thus they cannot be electrically contacted. Reducing this transfer time, i.e., an index time, is desirable since the index time is useless for the IC device testing. Hence, there is a need to minimize the index time in an automatic handler.

FIG. 7 shows a conventional automatic handler for an IC test system. As shown, test trays 20 are used as means of transferring IC devices 16 to be tested in the IC test system. A plurality of carrier modules 30 are maintained in a floating state in each test tray 20. An IC device 16 is mounted on each carrier module 30. The test trays 20 having the IC devices 16 are arranged at the supply area SU. IC devices 16 are then transferred to the test head area TH while being maintained on the test tray 20. At the test head area TH, the test tray 20 is carried on a belt conveyer 18 by a driving power of a motor 17 until the test tray is stopped by a projection of a stopper 11.

At the test head area TH, the test tray 20 is positioned and fixed by the stopper 11. Then, the IC devices 16 are pushed downward, for example, for the electric connection with the test contactors of the pin electronics (not shown) provided at the test head in the IC test system. The IC devices 16 keep electronic contact with the pin electronics in the IC test system during the testing. Recently, a plurality of test head areas are provided for performing simultaneous testing of IC devices mounted on a plurality of test trays. The test tray 20 is then transferred to the discharge area DI where the IC devices 16 are classified depending on the test results.

FIG. 8 is a schematic diagram showing an example of test process in a conventional automatic handler. In the example shown in FIG. 8A, there are four (4) IC devices 16 seated in the test tray 20. In recent years, smaller devices are widely used and thus a larger number of IC devices, such as eight (8) IC devices can be arranged in the test tray 20 according to the actual density of IC devices as shown in FIG. 8A.

However, a distance between the IC devices is limited to x in FIG. 8A because of the limitation in a packaging density such as in the contactors of the pin electronics in the test heads. Namely, since the test contactors in the pin electronics of the IC test system consist of mechanical and electronics parts and thus require a certain size and space which determines the minimum distance x.

Hence, in the example of FIG. 8A, four IC devices 16 are arranged in a length L of the test tray 20. The test tray 20 is shifted from the supply area SU to the test head area TH. After the test tray 20 is transferred to the stopper 11 in the test head area TH, each IC device 16 is electrically contacted by the pin electronics (not shown) as shown in FIG. 8B and the test is initiated. After the test, the projection of the stopper 11 withdraws so that the test tray 20 transfers to the discharge area DI. As a result, the test for the IC devices in the next test tray can be ready. In the above procedure, when the transfer speed of the test tray 20 is s, the index time per device is expressed $$t1=L/4s.$$

Since the IC test system of FIG. 8 has one test head, the index time per device per automatic handler is also $$t01=L/4s.$$

FIG. 9 is a schematic diagram showing an example of test process of IC device testing in another conventional automatic handler. In the example of FIG. 9, the IC test system includes two test heads TH1 and TH2. As shown in FIG. 9, eight (8) IC devices 16 are arranged in the test tray 20. The spacings between the IC devices to be tested are y where it is assumed that x/2<y<x. The IC devices 16 to be tested are arranged in the way that the spacing y between the IC devices 16 to be tested are minimized to the limit of the packaging density of the IC devices 16 in the length L of the test tray 20. In contrast, as discussed above with reference to FIG. 8, the distance x is determined by the density of the test contactors in the pin electronics which is larger than that of the IC devices.

As shown in FIG. 9A, the test tray 20 is transferred from the supply area SU to the first test head TH1 by the transfer system such as shown in FIG. 7. The position of the test tray is determined by the stopper $11_1$ provided at the first test head TH1 by the transfer system. Then, the IC devices 16 on the test tray are electrically contacted with the pin electronics in the test head area so that the test is initiated. Since there is a limitation in the density such as in the pin electronics or pin cards in the test heads, and thus the plurality of test contactors in the pin electronics have a greater spacing x than the spacing y of the IC devices 16 to be tested, not all IC devices 16 in the test tray 20 can be simultaneously tested. Therefore, for example, at the first test head TH1, only the IC devices 16 of odd lines in the test tray 20 are electrically contacted and tested. This is shown in FIG. 9B by the shades of the corresponding IC devices 16 in the test tray 20.

After finishing the test for the IC devices 16 in the odd lines, the projection of the stopper $11_1$ at the test head TH1 is detracted and the test tray 20 is transferred to the second test head TH2 as shown in FIG. 9C. The test tray 20 is positioned accurately at the second test head TH2 by the stopper $11_2$. At the test head area TH2, this time, only the IC devices 16 of even lines in the test tray 20 are electrically contacted by the pin electronics in the second test head TH2 as shown by the shaded lines in FIG. 9C.

Since there are two (2) test heads TH1 and TH2 are provided in this example and both test heads can perform the test simultaneously, it is possible for the second test head TH2 to test the IC devices in the even lines in the test tray 20 while the first test head TH1 simultaneously tests IC devices in the odd lines in the next test tray. Thus, all eight (8) IC devices 16 to be tested in the test tray 20 can be tested in the manner described above by allocating the IC devices to the first test head TH1 and the second test head TH2. After the test, the projection of the stopper $11_2$ at the second test head TH2 pulls back, and the test tray 20 is transferred to the discharge area DI as shown in FIG. 9D.

In this situation, when the transfer speed of the test tray 29 is expressed as s, the index time per device in the simultaneous testing performed continuously as above is:

$$t2=L/8s.$$

The index time per device per automatic handler is:

$$t02=L/4s.$$

As shown above, the index time per automatic handler needs L/4s for either t01 or t02 cases. Hence, whichever conventional means of FIGS. 7 or 9 are performed, the time length for the transfer of the test tray is limited to the index time above and cannot be decreased any further.

SUMMARY OF THE INVENTION

Therefore, it is an object of the present invention to provide an automatic handler for an IC test system which is capable of minimizing the index time required for transferring the test trays having IC devices to be tested by uniquely arranging a plurality of stoppers for positioning the test trays.

It is another object of the present invention to provide an automatic handler for an IC test system which is capable of minimizing the index time for transferring the test trays by providing a plurality of stoppers corresponding to a single test head of the IC test system to determine a plurality of positions in the test head area.

It is another object of the present invention to provide an automatic handler which is capable of increasing the number of test positions for the test tray by providing a groove on the test tray which receives and engages with projections of the stoppers.

It is a further object of the present invention to provide an automatic handler for an IC test system which is capable of minimizing the index time without increasing mechanical parts or spacing in the handler.

According to the first aspect of the present invention, IC devices to be tested are arranged in the length of the test tray to a limit of their density. After being transferred to a test head area by a transfer system, the test tray is positioned by a first positioning stopper. The IC devices in a predetermined line in the test tray are electrically contacted with contactors in pin electronics of the test head area and the IC test is performed. At this point, only the IC devices of odd lines, for example, are electrically contacted and tested at this first step since the spacing of the contactors in the test head is larger than that of the IC devices in the test tray.

After the test for the IC devices in the odd lines, a projection of the first positioning stopper is retracted so that the test tray is transferred to the next position where it is positioned by a second stopper. At this second step, only IC devices of even lines in the test tray are electrically contacted with the contactors in the pin electronics to proceed the IC test. Thus, when the test tray transfers from the first step to the second step, the test tray transfers the distance D which is the distance between the first stopper and the second stopper. This distance D is also identical to the spacing between the IC devices in the test tray.

After the test, a projection of the second stopper at the test head area is retracted and the test tray advances to a discharge area. In this case, the transfer distance of the test tray is (L–D). Thus, the transfer distance of the test tray is reduced compared to the conventional arrangement, which contributes to a reduction of the index time.

According to the second aspect of the present invention, a groove is provided on the test tray to receive the positioning stoppers therein. The groove has a predetermined length including an end surface the distance of which is an integer multiple, for example, twice as long as the distance between the positioning stoppers.

There can be several grooves on the test tray and at least one stopper is needed. Consequently, the number of possible test positions for the test tray is increased to the number of grooves multiplied by the number of stoppers.

Thus, by setting the distance between a flat surface in the front of the test tray and the end surface of the groove as twice as long as the distances between two stoppers, the total test positions for the test becomes four.

DETAILED DESCRIPTION OF THE INVENTION

Figure 5:
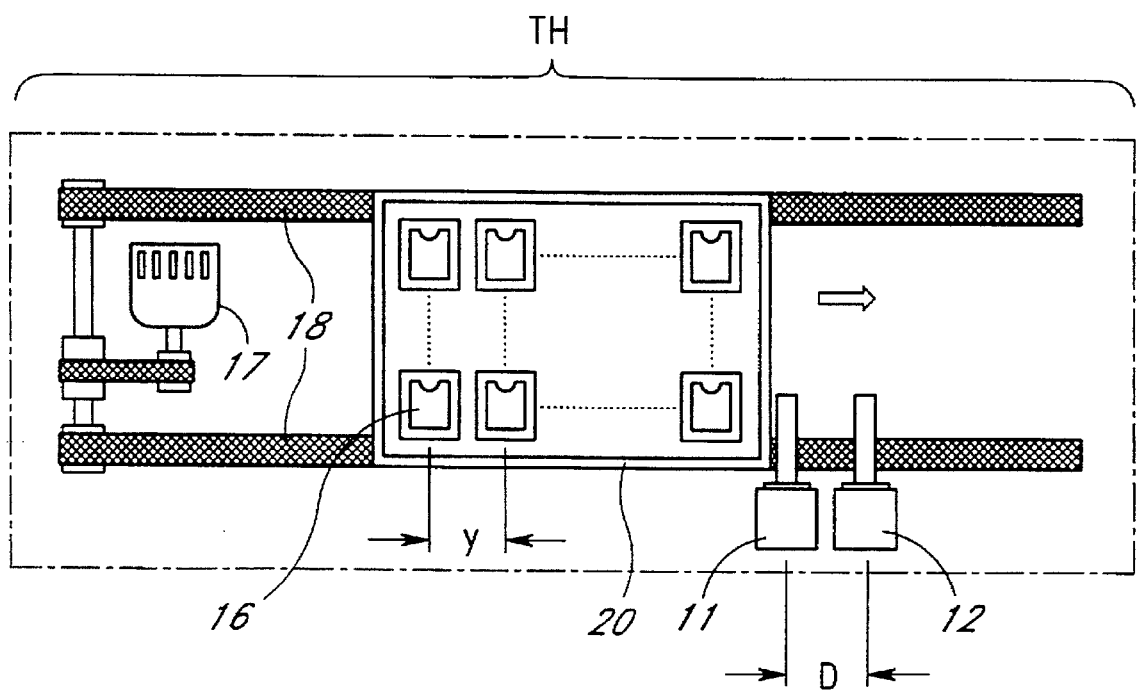
FIG. 5 is a plain view showing the first embodiment of the present invention.

Preferred embodiments of the present invention will be described with reference to the drawings. FIG. 5 shows the first embodiment of the present invention. FIG. 5 is a plan view showing an automatic handler corresponding to a test head area TH of an IC test system. The test tray 20 having the IC devices 16 to be tested is placed on the belt conveyer 18 which is driven by the motor 17 as in the same manner shown in FIG. 7. In FIG. 5, in addition to the conventional stopper 11, the second stopper 12 is also provided in the test head TH along a moving direction of the test tray 20. The distance D between the second stopper 12 and the first stopper 11 is adjusted to be equal to the distance y between the adjacent IC devices 16 to be tested in the test tray 20. The IC devices 16 to be tested in the test tray 20 is arranged in a manner discussed with respect to FIG. 9 where the spacing y between the IC devices is decreased to the minimum possible value. An operation of extension and withdrawal of the projection in each stopper is controlled independently.

FIG. 4 is a schematic diagram showing a test process of the IC devices 16 to be tested according to the automatic handler of the present invention. In the example of FIG. 4, eight (8) IC devices 16 to be tested are arranged in the test tray 20. Namely, the IC devices 16 to be tested are aligned in the test tray 20 such that the spacing between the adjacent devices is reduced to the minimum in terms of packaging density of the IC devices 16 to be tested. Thus, the IC devices 16 to be tested are aligned with the spacing y in the test tray 20 whose length is L.

Figure 4A:
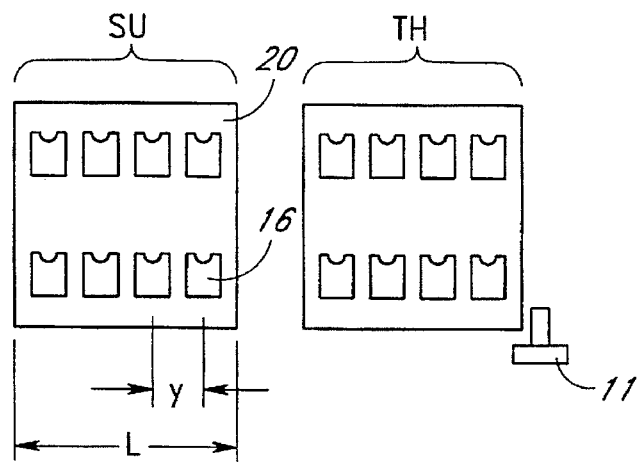
FIG. 4a–4d is a schematic diagram showing a test procedure of IC devices in accordance with the automatic handler of the first embodiment of FIG. 3.
Figure 4B:
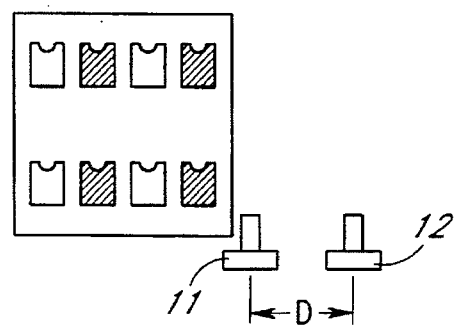

The test tray 20 is moved from the supply area SU to the test head area TH until it is stopped by the stopper 11 provided in the test head area TH as shown in FIG. 4A. Then the test tray 20 is pressed downward, for example, for accomplishing the electrical contact between the test contactors in the pin electronics of the IC test system and the IC devices 16 to be tested as shown in FIG. 4B. At this time, only the IC devices of the odd lines in the test tray 20 are electrically connected and tested as shown by the shaded lines of FIG. 4B. This is because the test contactors in the pin electronics in the test head TH have the minimum distance x which is different from the minimum distance y of IC devices in the test tray 20. Usually, the distance x between the adjacent test contactors is greater than the distance y between the adjacent IC devices 16 aligned in the test tray 20. Therefore, in this example, the distance x in the test head is adjusted to be x=2y to that the IC devices in the every other lines in the test tray 20 can be electrically connected with the test head.

Figure 4C:
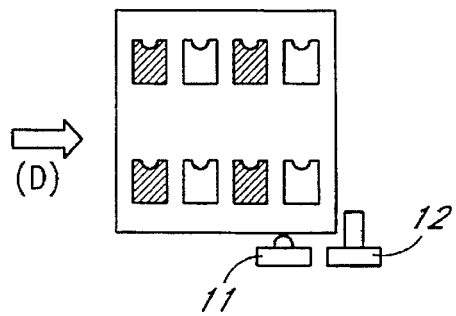

After finishing the test for the IC devices in the odd lines, the protrusion of the first stopper 11 is pulled in and the test tray 20 is transferred to the right hand side until it is stopped by the second stopper 12 as shown in FIG. 4C. The test tray 20 is then fixed by the projection of the second stopper 12 in the appropriate position in the test head area TH. As stated above, the spacing between the first stopper 11 and the second stopper 12 is D which is the same as distance y between the IC devices 16 in the test trays 20. Thus, when the test tray 20 transfers from the first step (FIG. 4B) to the second step (FIG. 4C), the IC devices in the even lines are positioned to contact with the contactors in the test head TH.

At this position, the IC devices in the even lines in the test tray 20 are electrically connected with the test contactors of the pin electronics in the IC test system and tested thereby. Therefore, in the first position which is determined by the first stopper 11, the IC devices 16 in the odd lines in the test tray 20 are tested and in the second position which is determined by the second stopper 12, the IC devices 16 in the even lines in the test tray 20 are tested. As a result, all of the eight (8) IC devices in the test tray 20 can be tested after the process of FIG. 4C. Then, the projection of the second stopper 12 is withdrawn and the test tray 20 is transferred to the discharge area DI.

Figure 4D:
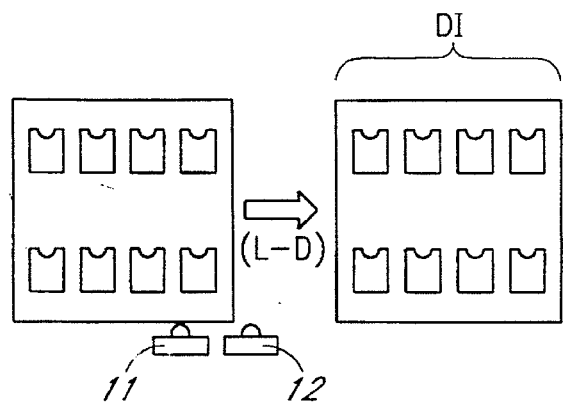

In this process, the transfer distance of the test tray 20 between the second position and the discharge area DI is (L−D) as shown in FIG. 4D. When the transfer speed of the test tray 20 is s, the index time per device is:

$$t3=(D/s+(L-D)/s)/8=L/8s$$

The index time per device per automatic handler is $$t03=L/8s$$

Figure 7:
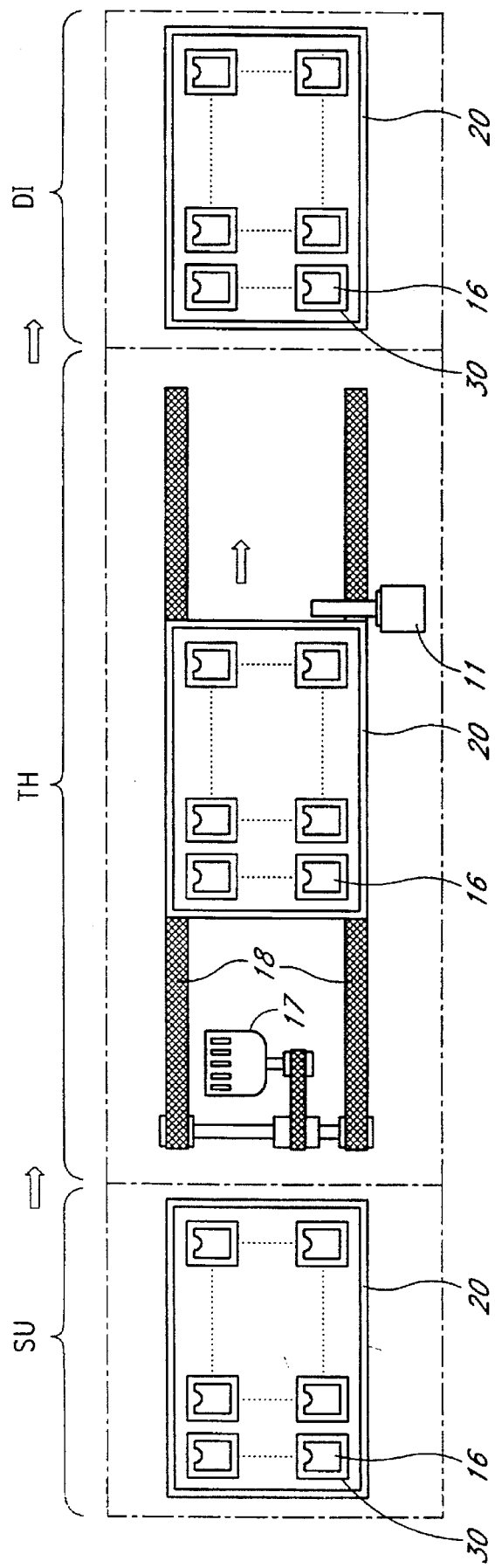
FIG. 7 is a diagram showing an example of conventional automatic handler for an IC test system.
Figure 8A:
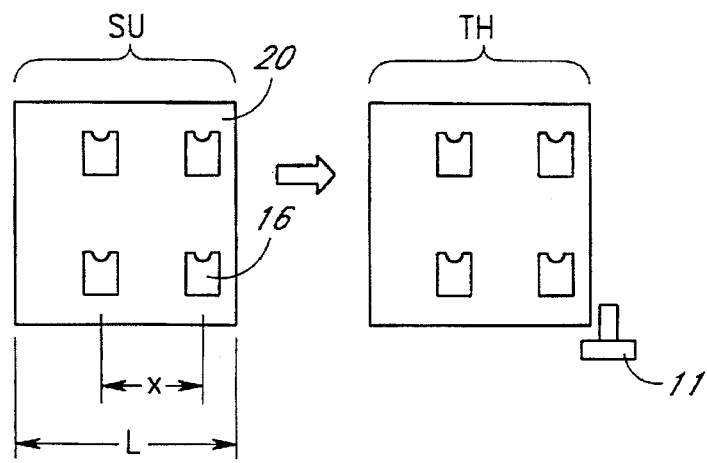
FIG. 8a–8c is a schematic view showing a test process for IC devices in the conventional automatic handler of FIG. 7.
Figure 8B:
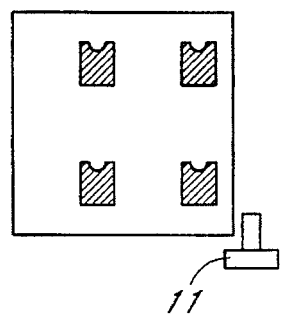
Figure 8C:
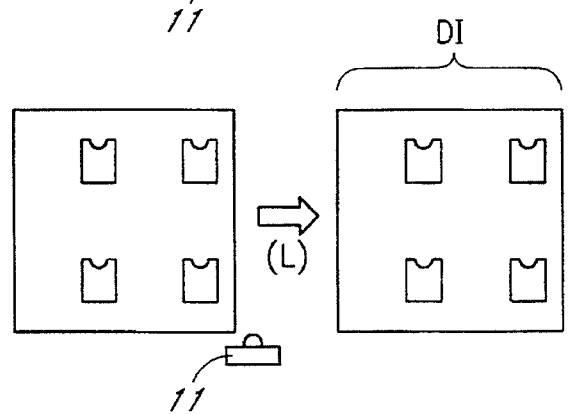
Figure 9A:
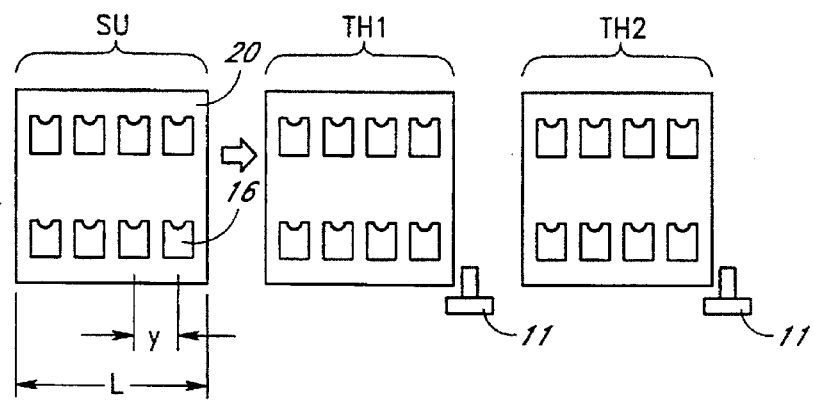
FIG. 9a–9d is a schematic view showing a test process for IC devices in another example of conventional automatic handler.
Figure 9B:
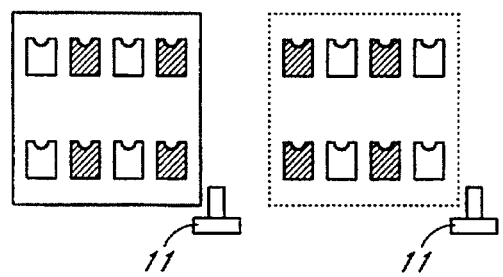
Figure 9C:
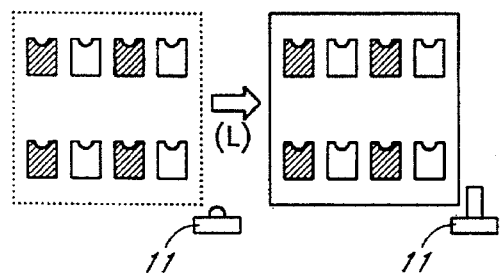
Figure 9D:
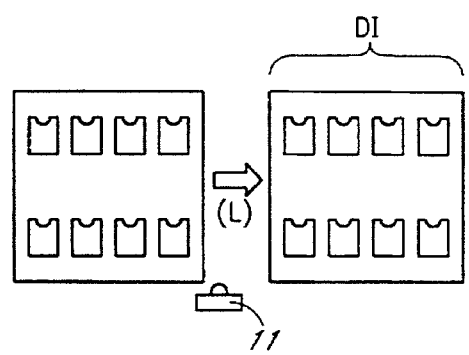

Hence, the index time in this example can be reduced to a half of that in the conventional automatic handler of FIGS. 7 or 9 in which the index time is L/4s.

In the above example, the IC test is performed in two steps, i.e., by dividing the IC devices in the odd lines and in the even lines in the test tray 20. However, based on the inventive features of the present invention, the test can be divided into three steps when even smaller IC devices to be tested are arranged in the test tray. In such a situation, the number of stoppers to be provided will be increased to three each of which is apart from one another by the distance the same as that of the IC devices in the test tray.

Further, the number of steps or the stoppers can be increased arbitrarily according to the relationship between the spacing in the IC devices in the tray and the spacing of the pin electronics in the test head. Even if the number of stoppers and thus the steps for testing the IC devices to be tested is altered, the index time can be increased in the same manner as describe in the foregoing. The only limitation in increasing the number of the stoppers is that the stoppers have to be aligned in the direction to which the test tray is transferred.

Figure 6:
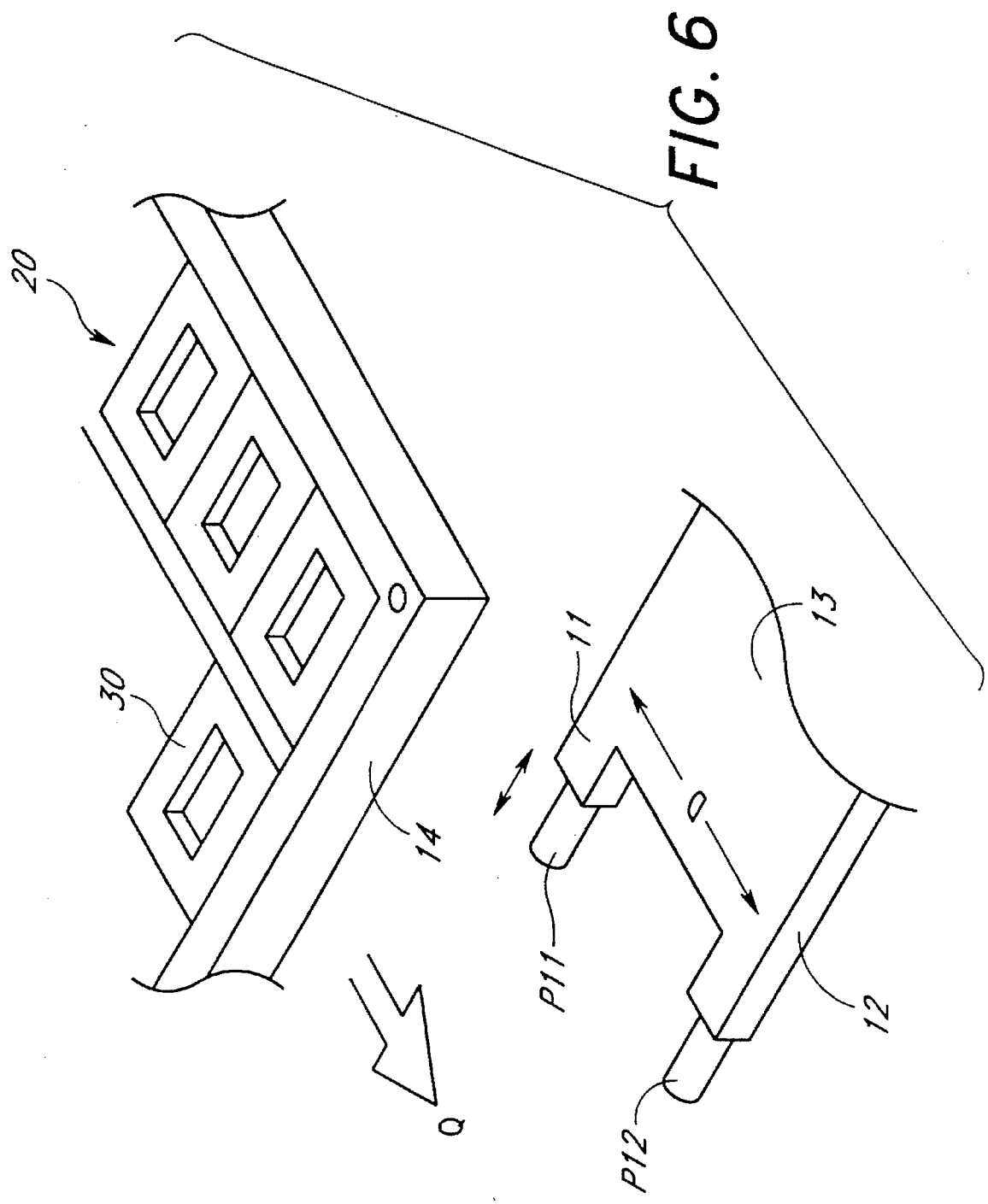
FIG. 6 is a perspective view for explaining the relationship between the test tray and the positioning stopper in the first embodiment of the present invention.

FIG. 6 shows an example of the test tray 20 and the positioning stoppers 11 and 12. In this example, the stopper 11 and the stopper 12 are distanced by a pitch D and are arranged on a stopper body 13. The projections $P_{11}$ and $P_{12}$ on the end of the stoppers 11 and 12, respectively, are driven independently from each other.

The test tray 20 is provided with, for example, 64 carrier modules 30 so that 64 IC devices to be tested can be loaded in the seats of the carrier modules 30. The test tray 20 has a flat surface 14 and is transferred to the moving direction Q in FIG. 6. In the test area, the flat surface 14 meets with the projection $P_{11}$ of the stopper 11 or the projection $P_{12}$ of the stopper 12 so that the appropriate positions of the IC devices to be tested is determined with respect to the pin electronics in the test head.

Thus, the test tray 20 can be stopped at two positions distanced by the pitch D on the test head area. The first positioning can be accomplished when the projection $P_{11}$ of the stopper 11 touches the flat surface 14. Then, after testing the predetermined lines of IC devices on the test tray 20, the projection $P_{11}$ is retracted in the stopper 11 so that the test tray 20 can further advances to the direction Q. The flat surface 14 of the test tray 20 then meets with the projection $P_{12}$ of the stopper 12, which determined the second position of the test tray 20 on the test head area.

FIG. 3 shows an arrangement of an automatic handler for use with an IC test system having two test heads (test chambers) TH1 and TH2 for testing the IC devices. In this arrangement, the automatic handler includes stoppers $11_1$ and $12_1$ for the first test head TH1, and stoppers $11_2$ and $12_2$ for the second test head TH2. In each pair of the stoppers, one stopper is separated by a distance D from the other. A pair of plural position sensors $15_1$ and $15_2$ are also provided in each test head for monitoring the movement of the test trays 20. In this example, although not shown, the test contactors of the pin electronics in each of the test heads TH1 and TH2 have a spacing with respect to the adjacent contactors by a distance which is four times larger than the distance D between the IC devices 16.

Figure 3A:
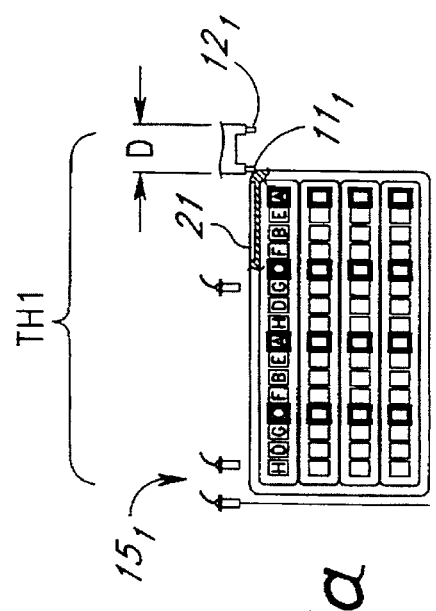
FIG. 3a–3d is a schematic view of the first embodiment of the automatic handler in accordance with the present invention showing a situation where test trays stop at two (2) positions in a test head area.
Figure 3B:
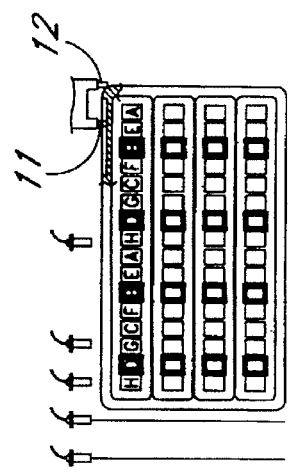

Thus, in the first test head TH1, four lines (A, C, A, C) of IC devices in the test tray 20 are first tested at the position determined by the stopper $11_1$ as shown in FIG. 3a. Then, also in the test head TH1, another four lines (B, D, B, D) of IC devices in the test tray 20 are tested at the position determined by the stopper $12_1$ as shown in FIG. 3b, which is shifted by the distance D from the previous position. Namely, in this example, 32 IC devices are tested in the first test head TH1.

Figure 3C:
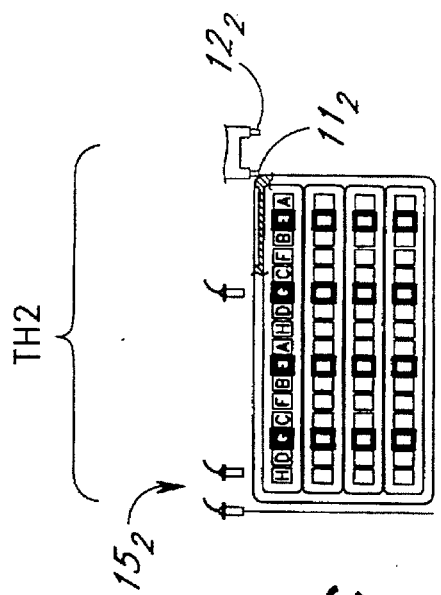
Figure 3D:
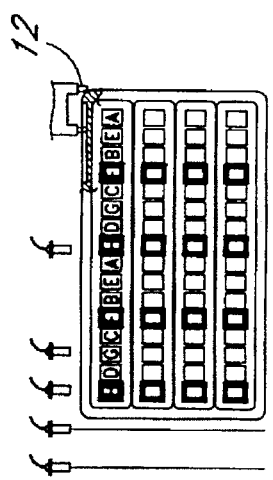

The test tray 20 is then transferred to the second test head TH2 as shown in FIGS. 3c and 3d. In the second test head TH2, four lines (E, G, E, G) of IC devices in the test tray 20 are first tested at the position determined by the stopper $11_2$ as shown in FIG. 3c. Then, also in the second test head TH2, another four lines (F, H, F, H) of IC devices in the test tray 20 are tested at the position determined by the stopper $12_2$ as shown in FIG. 3d, which is shifted by the distance D from the previous position. Thus, in this example, a total of 64 IC devices are tested in the first and second test heads TH1 and TH2.

In the example of FIGS. 3 or 5, when more devices are attempted to be tested in each test head or when the spacing difference between the IC devices to be tested and the pin electronics is greater than the example of FIG. 3, the IC test can be carried out in a similar manner by increasing the number of stop positions in each test head. Such an increase of stop positions is possible by providing the corresponding number of stoppers in the direction where the test tray advances. However, the following problem occurs in such modification. Namely, the number of stop positions may be limited since the number of stoppers have to be increased accordingly. One of the reasons is that the increase in the number of stoppers causes an increase of corresponding mechanical parts and drive mechanism which will increase the overall size of the automatic handler.

FIG. 1 shows the second embodiment of the present invention which is able to increase the number of stop positions without increasing the number of stoppers. FIG. 1 shows an example in which four (4) stop positions are established for each test head. In this example, the positioning stoppers 11 and 12 are the same as the one used in the first embodiment and may be mounted on the stopper body 13 as discussed with reference to FIG. 6. The major difference between the first embodiment and the second embodiment is that, in this embodiment, it is provided with a groove 21 on the test tray 20 to receive the stoppers 11 and 12 therein. The groove 21 is positioned on the side of the test tray 20 which is in parallel to the tray moving direction. The end surface 22 of the groove 21 has an accurate distance D from the flat surface 14 of the test tray 20, which is, for example, two time as long as the distance between D the stoppers 11 and 12.

With further reference to FIG. 1, the operation of positioning the test tray at the 4 positions is explained. In the following, the state where the projections of the stopper 11 or 12 expands to stop the test tray 20 is regarded as ON, while the state where the projection of the stopper 11 or the stopper 12 retracts to allow the test tray 20 go forward is regarded as OFF.
Position A The stopper 11 and the stopper 12 are both turned ON as shown in FIG. 1a. The projection of the stopper 11 contacts the flat surface 14 of the test tray so as to fix the position A of the test tray 20.
Position B The projection of the stopper 11 is turned OFF at the position A so that the test tray 20 advances in the right hand direction until the flat surface 14 contacts with the projection of the stopper 12. The test tray 20 then stops at the position B which is a distance D from the position A.
Position C At the position B, the stopper 11 is turned ON while the stopper 12 is turned OFF. Thus, the projection of the stopper 11 is in the groove 21 of the test tray 20. The test tray 20 moves in the transfer direction until the end surface 22 of the groove 21 meets with the projection of the stopper 11. The test tray 20 then stops at the position C which is a distance D from the position B.
Position D At the position C, the stopper 12 is turned ON while the stopper 11 is turned OFF. Thus, the projection of the stopper 12 is in the groove 21 of the test tray 20 while the projection of the stopper 11 withdraws from the groove 21. The test tray 20 moves in the transfer direction until the end surface 22 of the groove 21 contacts the projection of the stopper 12. The test tray 20 then stops at the position D which is a distance D from the position C.

Therefore, in the example of FIG. 1, the four test positions each of which is apart from the other by the distance D are realized by the two stoppers 11 and 12. The IC devices in the corresponding positions in the test tray 20 will be tested in each position. After the test, the stopper 11 and the stopper 12 are turned OFF in order to transfer the test tray 20 to the next test head or the discharge area of the automatic handler.

FIG. 2 shows an example of automatic handler where the stoppers and the groove in test tray shown in FIG. 1 are used in the IC test system having two test heads (test chambers) TH1 and TH2 for testing the IC devices. In this arrangement, similar to the example of FIG. 3, the automatic handler includes stoppers $11_1$ and $12_1$ for the first test head TH1 and stoppers $11_2$ and $12_2$ for the second test head TH2. In each pair of the stoppers, one stopper is separated by a distance D from the other. The IC devices to be tested in the test tray 20 are also apart from one another by the distance D.

The test tray 20 is provided with a groove 21 and a end surface 22 of the groove as shown in FIG. 1. The end surface is distanced from the flat surface 14 of the test tray 20 by 2D. A pair of plural position sensors $15_1$ and $15_2$ are also provided in each test head for monitoring the movement of the test trays 20. Although not shown, the pin electronics in each of the test heads TH1 and TH2 has a spacing with respect to the adjacent pin electronics by a distance which is eight times larger than the distance D between the IC devices.

Figure 1A:
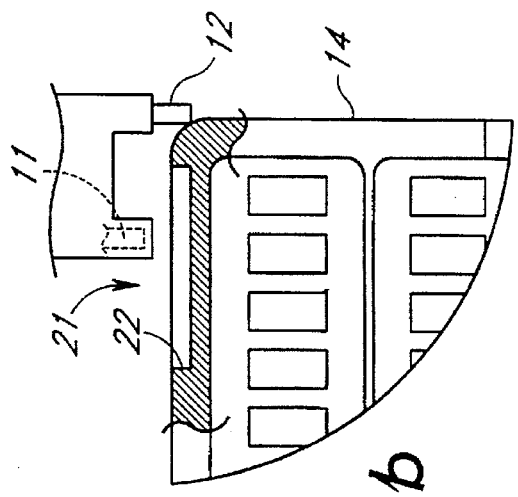
FIGS. 1a–1d is a schematic view showing the second embodiment of the automatic handler in accordance with the present invention.
Figure 1B:
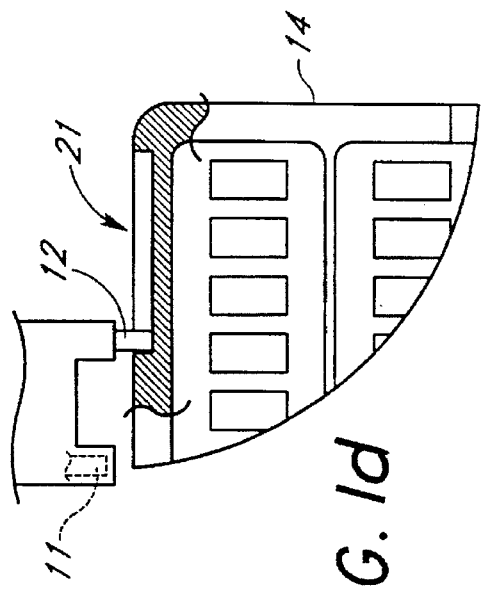
Figure 1C:
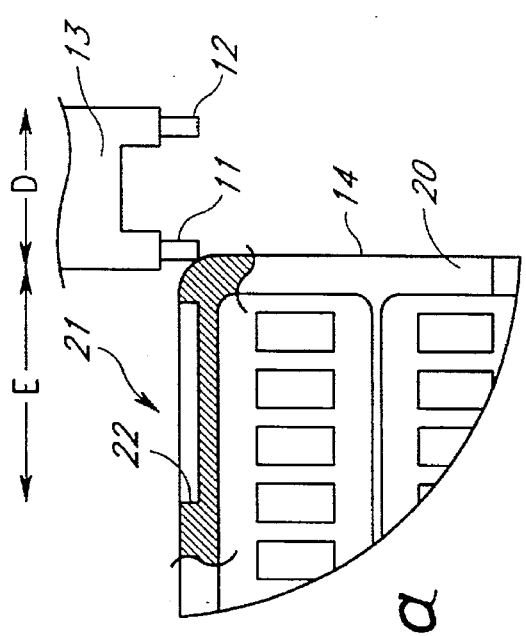
Figure 1D:
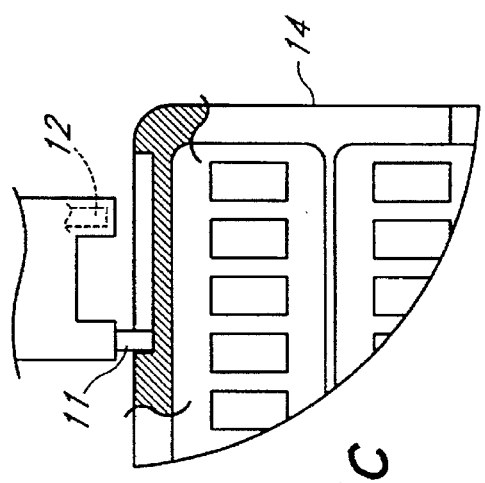
Figure 2E:
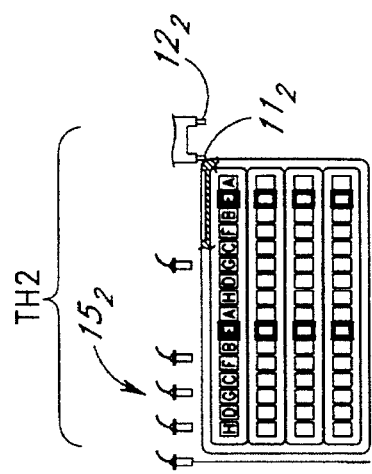
FIGS. 2a–2h is a schematic view of an automatic handler for explaining a situation where test trays stop at four (4) positions in a test head area in the second embodiment of the present invention of FIG. 1.
Figure 2F:
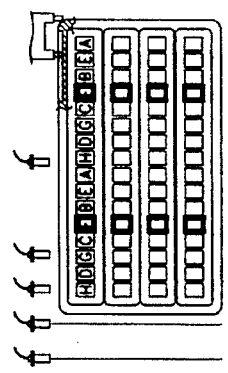
Figure 2G:
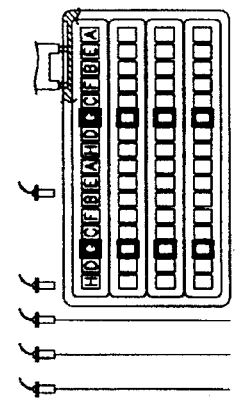
Figure 2H:
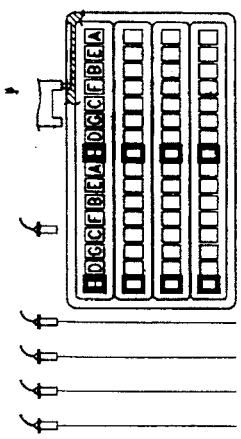
Figure 2A:
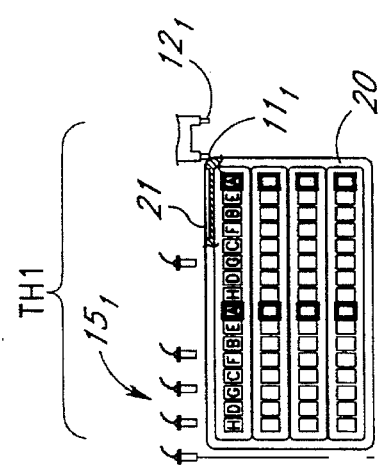
Figure 2B:
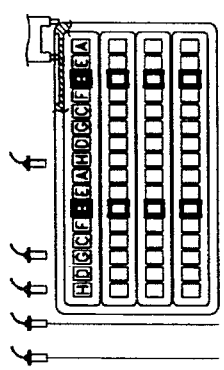
Figure 2C:
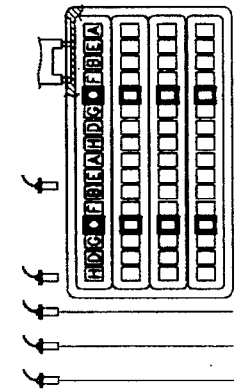
Figure 2D:
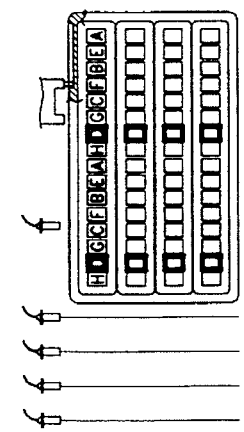

Thus, in the first test head TH1, the IC devices in the two lines (A, A) in the test tray 20 are first tested at the position A determined by the stopper $11_1$ as shown in FIG. 2a. Then, also in the test head TH1, another two lines (B, B) of IC devices are tested at the position B determined by the stopper $12_1$ as shown in FIG. 2b, which is shifted by the distance D from the previous position. Further, the IC devices in two lines (C, C) are tested at the position C which is determined by the stopper $11_1$ and the groove 21. Moreover, the IC devices in two lines (D, d) are tested at the position D which is determined by the stopper 112 and the groove 21. Namely, in this example, 32 IC devices are tested in the first test head TH1.

The test tray 20 is then transferred to the second test head TH2 wherein the IC devices in each two lines in the test tray 20 are tested in the same manner in the first test head TH1 as described above as shown in FIGS. 2e–2h. Thus, in the test head TH2, the test tray 20 is positioned in the four positions by the pair of stoppers $12_1$ and $12_2$ in each position of which the IC devices of each two lines in the test tray are tested. Therefore, in this arrangement of FIG. 2, a total of 64 IC devices are tested in the first and second test heads TH1 and TH2.

In the above example, it is disclosed that a single groove is provided on the test tray to increase the number of test positions. However, the present invention can be applied to a situation where two or more grooves are provided on the test tray 20 to further increase the number of test positions without increasing the number of stoppers. Namely, the number of positions for the test tray 20 can be increased by the numbers of grooves multiplied by the numbers of stoppers.

The distance E that is from the flat surface 14 of the test tray 20 to the end surface 22 of the groove 21 in FIG. 1 can be made twice as long as D which is the distance between the stopper 11 and the stopper 12. Then, the test tray 20 can stop at each position spaced by the distance D. Also, the test tray 20 can be stopped at different intervals by changing the distances D and E.

According to the present invention, when the first embodiment is performed, the following advantages are obtained. The index time is decreased to a half of the conventional ones since an automatic handler for an IC test system is comprised of a plurality of stoppers 11 and 12 provided along the moving direction of the test tray 20 in a test head area. Thus, the present invention provides an automatic handler for an IC test device which is able to reducing the index time required when devices to be tested are transferred from the supply area to the test head area or from the test head area to the discharge area in the IC test system.

When the second embodiment is implemented, the number of test positions for the test tray per test head can be increased without increasing mechanical components or spaces in the automatic handler. Consequently, IC devices to be tested at one position can be reduced and the number of stops can be the same as conventional ones. Hence, an automatic handler of the present invention allows flexibility of IC test where the number of devices to be tested at a time is increased and freely selectable.

We claim:

1. An automatic handler for an IC test system to test IC devices by transferring the IC devices from a supply area to a test head area which has a plurality of test contactors and further transferring the tested IC devices from the test head area to a discharge area, comprising:

a test tray for carrying said IC devices to be tested in a plurality of lines each line of which carries a plurality of said IC devices, said test tray transferring said IC devices to said test head area and said discharge area, said IC devices to be tested are aligned in said test tray with a distance between adjacent IC devices which is shorter than a distance between adjacent test contactors in said test head area;

a pair of positioning stoppers provided in said test head area along a moving direction of said test tray, said positioning stoppers being spaced by a distance equal to said distance of said IC devices to be tested in said test tray;

wherein said distance of said contactors is adjusted to be two times or more of said distance of said IC devices to be tested in said test tray, one of said positioning stoppers contacts said test tray to determine a first position for simultaneously testing said IC devices in a first group of said lines in said test tray, and said test tray is transferred until other positioning stoppers contacts said test tray in a second position for simultaneously testing said IC devices in a second group of said lines in said test tray, said test tray being transferred to said discharge area after said testing.

2. An automatic handler as defined in claim 1, further includes an additional pair of said positioning stoppers corresponding to an increase in a number of said test head area in said IC test system.

3. An automatic handler as defined in claim 1, wherein said positioning stopper includes a projection which expands or retracts to positioning said first and second positions of said test tray.

4. An automatic handler as defined in claim 1, wherein said test tray includes a flat surface to meet with said projection of said positioning stopper, said first position and second position are determined when said flat surface contacts said projections of said pair of positioning stoppers.

* * * * *